US007012968B2

(12) United States Patent
Kim et al.

(10) Patent No.: US 7,012,968 B2

(45) Date of Patent: Mar. 14, 2006

(54) APPARATUS FOR DETECTING AND ADJUSTING TRANSMISSION POWER OF CDMA SYSTEM

(75) Inventors: Kwan Kim, Seoul (KR); Woo-Sik Kim, Seoul (KR)

(73) Assignee: LG Electronics, Inc., Seoul (KR)

(*) Notice: Subject to any disclaimer, the term of this patent is extended or adjusted under 35 U.S.C. 154(b) by 797 days.

(21) Appl. No.: 09/995,671

(22) Filed: Nov. 29, 2001

(65) Prior Publication Data

US 2002/0094014 A1 Jul. 18, 2002

(30) Foreign Application Priority Data

Nov. 30, 2000 (KR) .............................. 2000-71849
May 30, 2001 (KR) .............................. 2001-30063

(51) Int. Cl.
*H04L 27/04* (2006.01)
*H04L 27/12* (2006.01)
*H04L 27/20* (2006.01)

(52) U.S. Cl. ....................... 375/295; 370/342; 455/522

(58) Field of Classification Search ................ 375/295, 375/296, 297, 219, 259; 370/320, 335, 342, 370/441; 455/561, 115.1, 127.1, 522, 67.11, 455/13.4, 127.2
See application file for complete search history.

(56) References Cited

U.S. PATENT DOCUMENTS 5,524,285 A * 6/1996 Wray et al. ................. 455/126
5,590,409 A * 12/1996 Sawahashi et al. ........... 455/69
5,625,322 A * 4/1997 Gourgue et al. ............ 330/129
5,694,431 A * 12/1997 McCoy ....................... 375/295
6,229,998 B1 * 5/2001 Hamdy et al. ........... 455/226.1
6,272,125 B1 * 8/2001 Nomura ...................... 370/342
6,275,106 B1 * 8/2001 Gomez ....................... 330/151
6,301,485 B1 * 10/2001 Lee ............................ 455/522
6,600,792 B1 * 7/2003 Antonio et al. ............. 375/297
6,741,661 B1 * 5/2004 Wheatley et al. ........... 375/296
6,741,867 B1 * 5/2004 Tetsuya ...................... 455/522
6,834,182 B1 * 12/2004 Fu .......................... 455/115.1
2002/0082039 A1 * 6/2002 Ue et al. .................... 455/522
2002/0101937 A1 * 8/2002 Antonio et al. ............. 375/297
2002/0119798 A1 * 8/2002 Hamabe ..................... 455/522
2003/0058821 A1 * 3/2003 Lee et al. .................. 370/335

* cited by examiner

*Primary Examiner*—Jean B. Corrielus
(74) *Attorney, Agent, or Firm*—Fleshner & Kim, LLP

(57) ABSTRACT

A transmission power detecting apparatus of a CDMA system is disclosed by which since the power detection of the RF CDMA signal is digitally performed and no RF device (an RSSI detector) which is sensitive to a temperature change is used, a power of the RF CDMA signal can be more accurately detected. In addition, since an IF analog CDMA signal to be measure is sampled and then an average power of the sampled digital IF CDMA signal is obtained, accuracy in power detection and transmission power adjustment can be accomplished. Moreover, since the power of the baseband digital CDMA signal containing a traffic is detected to provide a reference value for adjusting the power of the RF CDMA signal, an error generated in determining a power of the RF CDMA signal as in the conventional art can be reduced.

18 Claims, 8 Drawing Sheets

100
10
20
30
40
200
PCM DATA
WALSH GENERATOR
11
PN-I CODE
PN-Q CODE
12
13
21
22
Σ
FIR
31
32
DAC
33
34
LPF
35
36
COSwt
SINwt
37
38
39
41
LO RF
BPF
42
43
60
LO IF
61
BPF
62
ADC
63
FIFO
64
FIR
65
FFT UNIT
TEMPERATURE SENSOR
103
MEMORY
104
DIGITAL PROCESSOR
102

100
10
20
30
40
200
300
PCM DATA
WALSH GENERATOR
11
12
13
PN-I CODE
PN-Q CODE
21
22
31
32
FIR
FIR
33
34
DAC
DAC
35
36
LPF
LPF
COSwt
SINwt
37
38
39
41
42
43
BPF
LO RF
60
LO IF
61
BPF
62
ADC
63
FIFO
64
FIR
65
FFT UNIT
71
72
SQUARE UNIT
SQUARE UNIT
73
74
FIR
75
FFT UNIT
TEMPERATURE SENSOR
103
MEMORY
104
DIGITAL PROCESSOR
102

APPARATUS FOR DETECTING AND ADJUSTING TRANSMISSION POWER OF CDMA SYSTEM

BACKGROUND OF THE INVENTION

1. Field of the Invention

The present invention relates to a base station transmitting apparatus of a CDMA system, and more particularly, to an apparatus for detecting and adjusting a transmission power of a base station transmitter.

2. Description of the Background Art

FIG. 1 is a schematic block diagram of a transmitting power detecting apparatus of a CDMA system in accordance with a conventional art.

As shown in FIG. 1, a transmission power detecting apparatus of a conventional CDMA system includes a base station transmitting unit 100 for converting a PCM signal to a radio frequency (RF) CDMA signal and transmitting it to a terminal; a transmission power detecting unit 101 for detecting power of the RF CDMA signal transmitted from the base station transmitting unit 100; and a digital processor 102 for compensating the power of the RF signal detected by the transmission power detecting unit 101 for the loss caused by the temperature.

The base station transmitting unit 100 includes a modem 10 for directly spreading a spectrum of a PCM data; a digital combiner 20 for summing the directly spread spectrum of the CDMA signal by channels (I, Q); an IF signal processor 30 for converting a base band CDMA signal outputted from the digital combiner 20 to an intermediate frequency (IF) signal; and an RF signal processor 40 for converting/amplifying the converted IF CDMA signal to a radio frequency (RF) signal and outputting it to an antenna.

The modem 10 includes a Walsh generator 11 for multiplying the inputted CDMA signal by a Walsh code; and first and second multipliers 12 and 13 for respectively multiplying pseudo noise (PN-I and PN-Q) codes to the output signal of the Walsh generator 11 in order to directly spread the spectrum of the CDMA signal.

The combiner 20 includes adders 21 and 22 for adding the CDMA signal which has been directly spread in the modem 10 by sectors.

The IF signal processor 30 includes finite impulse response filters (FIR) 31 and 32 for respectively filtering the digital CDMA signal outputted from the combiner 20; digital/analog converters (DAC) 33 and 34 for converting the filtered digital CDMA signal to an analog signal; low pass filters (LPF) 35 and 36 for filtering the analog-converted CDMA signal; mixers 37 and 38 for multiplying the filtered analog CDMA signal by a carrier signal (cosωt, sinωt) and converting it into an IF CDMA signal; and an adder 39 for adding the analog CDMA signals which have been converted into the IF signals by the mixers 37 and 38 and quadrature phase-shift key (QPSK) modulating it.

The RF signal processor 40 includes a mixer 41 for mixing the IF CDMA signal which has been QPSK modulated by the IF signal processor 30 with a local oscillation signal ($LO_{RF}$) and up-converting it to an RF CDMA signal; a band pass filter (BPF) 42 for removing a spurious component of the RF CDMA signal outputted from the mixer 41; and an amplifier 43 for amplifying the RF CDMA signal which has been filtered by the BPF 42 and outputting it to the antenna.

The transmission power detecting unit 101 includes a mixer 51 for mixing the RF CDMA signal with a local oscillation signal ($LO_{IF}$) and down-converting it to an IF CDMA signal; a BPF 52 for filtering the IF CDMA signal; a received signal strength indicator (RSSI) detector 53 for detecting a power strength of the IF CDMA signal which has been filtered by the BPF 52; and an analog/digital converter (ADC) 54 for digital-converting the voltage value detected by the RSSI detector 53.

Reference numerals 103 and 104 denote a temperature sensor and a memory, respectively.

The operation of the transmission power adjusting unit of the base station transmitting apparatus according to the conventional art constructed as described above will now be explained with reference to the accompanying drawings.

When the PCM data is inputted, the base station modem 10 directly spread the spectrum of the PCM data to the digital baseband CDMA signal by sectors, and outputs it through the channel 'I' (Inphase) and a channel 'Q' (Quadrature phase) to the digital combiner 20.

Then, the digital combiner 20 sums the CDMA signals outputted from the base station modem 10 by means of the multipliers 21 and 22 by sectors, and outputs it to the IF processor 30.

The IF processor 30 converts the digital CDMA signal outputted from the digital combiner 20 into an IF CDMA signal and sums the IF CDMA signals of the channel 'I' and the channel 'Q' and QPSK-modulates it. That is, the FIR filters 31 and 32 of the IF processor 13 filter the digital baseband CDMA signal inputted through the channel 'I' and the channel 'Q', respectively, and the DACs 33 and 34 convert the filtered digital CDMA signal into an analog CDMA signal.

LPFs 35 and 36 removes an unnecessary components from the analog-converted CDMA signal and output it to the mixers 37 and 38. The mixers 37 and 38 mix the filtered analog CDMA signals with the carrier signal (cosωt, sinωt) and convert the baseband CDMA signal into an IF CDMA signal, respectively.

Then, the adder 39 adds the analog IF CDMA signals outputted from the mixers 37 and 38 and outputs QPSK-modulated CDMA signals.

The mixer 41 of the RF signal processor 40 mixes the local oscillation signal ($LO_{RF}$) with the QPSK-modulated CDMA signal and converts the analog IF CDMA signal into an analog RF CDMA signal.

The BPF 42 removes a spurious component from the RF CDMA signal and transmits through the amplifier 43. Accordingly, the amplifier 43 amplifies the RF CDMA signal and transmits it through the antenna to a destination.

At this time, the transmission power detector 101 detects the power of the RF CDMA signal outputted from the base station transmitting unit 100 in the voltage form and outputs it to the digital processor 102. That is, the mixer 51 mixes the RF CDMA signal outputted from the base station transmitting unit 100 and the local oscillation signal ($LO_{IF}$) and converts it into an IF CDMA signal. The converted IF CDMA signal is filtered by the BPF 52 and inputted to the RSSI detector 53.

The RSSI detector 53 outputs a certain voltage corresponding to the strength of the inputted IF CDMA signal to the ADC 54, and the ADC 54 digitally converts the inputted analog voltage and outputs it to the digital processor 102.

Accordingly, the digital processor 102 reads a compensation value stored in the memory 104 corresponding to a current temperature provided from the temperature sensor 103, and performs a compensation operation for the digital voltage inputted from the ADC 54. That is, the digital processor 102 recognizes the power of the RF CDMA signal currently outputted from the base station transmitting unit 100 by adjusting the strength of the RF CDMA signal according to the temperature.

In this manner, the transmission power adjusting unit of the conventional base station transmitting apparatus detects the power of the final RF CDMA signal detected by the RSSI detector and compensates the power of the RF CDMA signal according to the temperature change.

In this respect, since the thermostatic device such as the RSSI detector 53 is generally sensitive to heat, failing to accurately detect the power of the detected RF CDMA signal.

Especially, as shown in FIG. 2, the analog voltage outputted from the RSSI detector 53 exhibits the sharp change ($\Delta t1 \rightarrow \Delta t3$) in the time domain, having a high possibility that an error would occur in measuring the power.

In addition, since the data stored in the memory 104 has been produced on the basis of an overhead channel, that is, for example, a pilot channel, a sync channel and a paging channel, etc. except for a traffic, when the power of the RF CDMA signal is actually determined on the basis of the stored data, a considerable error occurs inevitably.

The above references are incorporated by reference herein where appropriate for appropriate teachings of additional or alternative details, features and/or technical background.

SUMMARY OF THE INVENTION

Therefore, an object of the present invention is to provide a transmission power detecting apparatus of a CDMA system that is capable of accurately detecting a power of an RF CDMA signal which is finally outputted.

Another object of the present invention is to provide a transmission power adjusting apparatus of a CDMA system that is capable of accurately adjusting a power of an RF CDMA signal which is finally outputted.

To achieve at least the above objects in whole or in parts, there is provided a transmission power detecting apparatus of a CDMA system including: a base station transmitting unit for transmitting a radio frequency (RF) CDMA signal to a terminal; a transmission power detecting unit for detecting an average power of the transmitted RF CDMA signal in a frequency domain; and a digital processor for compensating the detected average power with a temperature compensation value stored in a memory and checking the power of the RF CDMA signal.

To achieve at least these advantages in whole or in parts, there is further provided a transmission power adjusting apparatus of a CDMA system including: a base station transmitting unit for converting a baseband digital CDMA signal into an RF CDMA signal and transmitting it; a detecting unit for detecting a power of the RF CDMA signal in a first frequency domain; an average power detecting unit for detecting a power of the baseband digital CDMA signal in a second frequency domain; and a digital processor for comparing the detected transmission power and the average power and controlling the power of the RF CDMA signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

Figure 3:
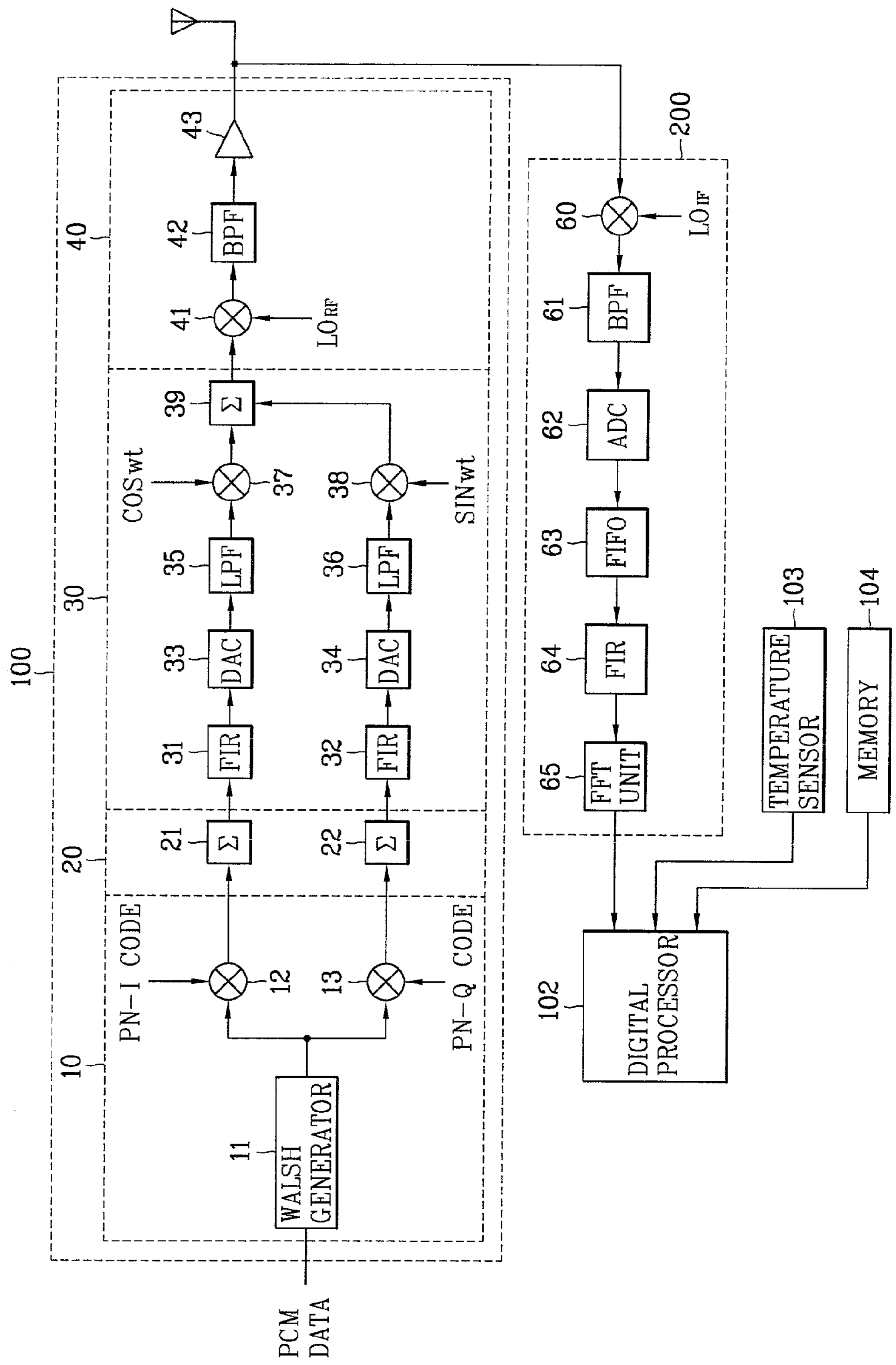
FIG. 3 is a drawing illustrating a transmission power detecting apparatus of a CDMA system in accordance with a preferred embodiment of the present invention.

FIG. 3 is a drawing illustrating a transmission power detecting apparatus of a CDMA system in accordance with a preferred embodiment of the present invention.

Figure 1:
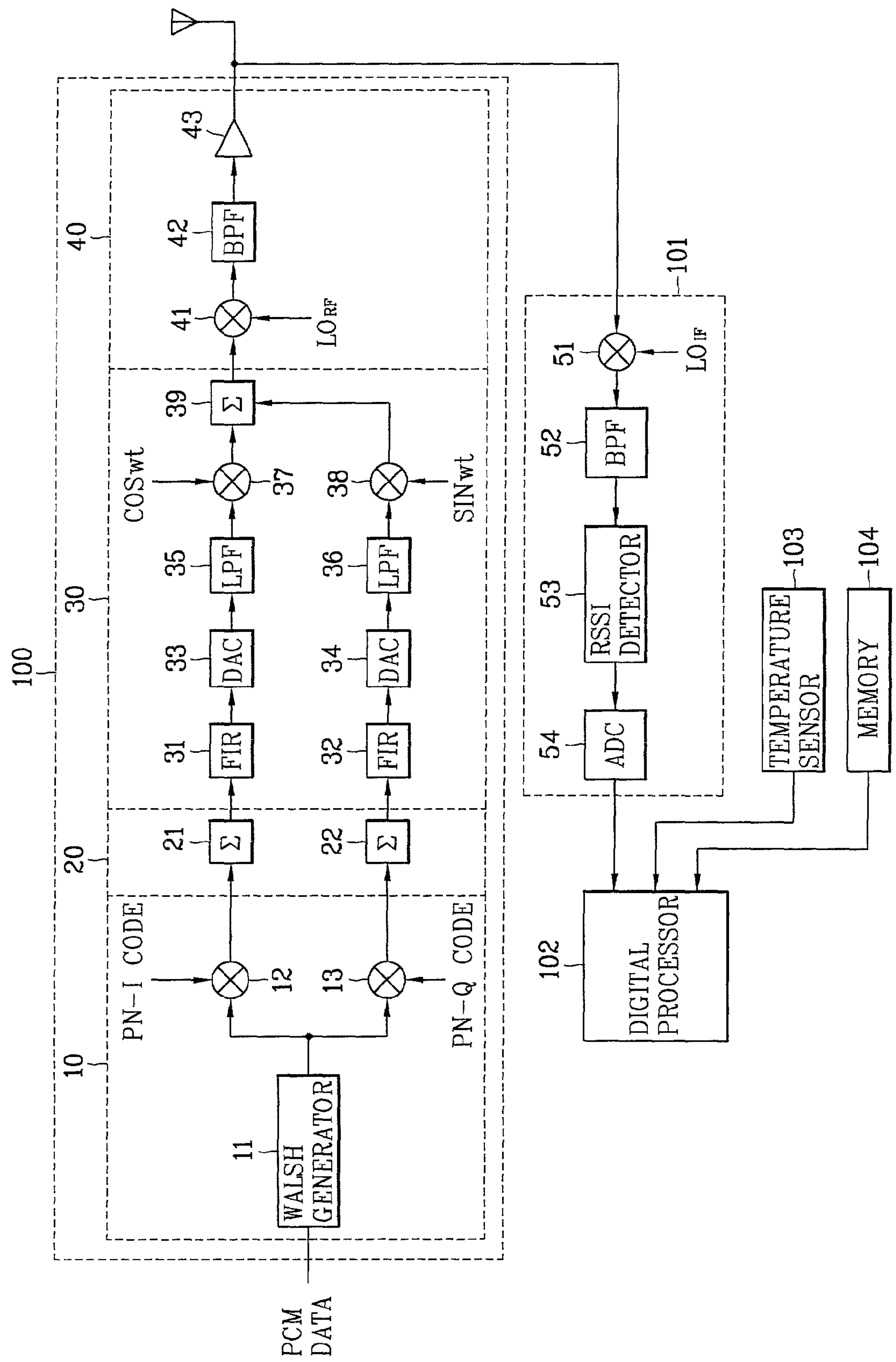
FIG. 1 is a schematic block diagram of a transmission power detecting apparatus in accordance with a conventional art.
Figure 2:
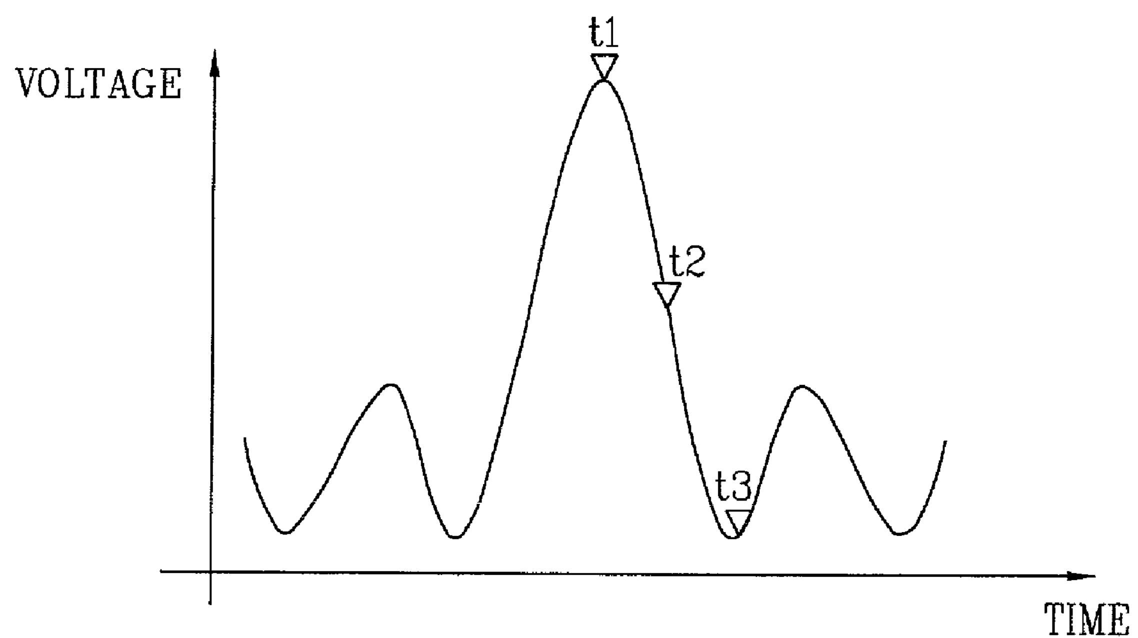
FIG. 2 is a drawing illustrating variation of an RF CDMA signal in a time domain.

As shown in FIG. 3, the transmission power detecting apparatus of a CDMA system of the present invention has the same construction as that of the conventional art as illustrated in FIG. 2, only except for a transmission power detecting unit 200. The same reference numerals are given to the same elements as those of the conventional art.

The transmission power detecting unit 200 includes a mixer 60 for down-converting an RF CDMA signal outputted from the base station transmitting unit 100 into an IF CDMA signal; a BPF 61 for filtering the down-converted IF CDMA signal; an ADC 62 for sampling the filtered IF CDMA signal and digital-converting it; a first-in first-out (FIFO) memory 63 for storing the digital-converted IF CDMA signal; an FIR 64 for removing an interference signal from the IF digital CDMA signal outputted from the FIFO memory 63; and a Fourier Transform (FFT) unit 65 for Fourier-converting the filtered IF digital CDMA signal and computing an average power of the RF CDMA signal.

The operation of the transmission power detecting apparatus of a CDMA system constructed as described above will now be explained.

The digital power detector 200 detects a power of the RF CDMA signal outputted from the base station transmitting unit 100 in the frequency domain. That is, the inputted RF CDMA signal is mixed with an oscillation signal ($LO_{IF}$) by the mixer 60 and converted to an IF CDMA signal. The converted IF CDMA signal is filtered by the BPF 61. The filtered IF CDMA signal is converted back into a digital CDMA signal by the ADC 62 and stored in the FIFO 63 for a digital processing.

The FIR filter 64 filters the IF digital CDMA signal outputted from the FIFO 63 and designates a frequency domain of the IF digital CDMA signal to be processed by the FFT unit 65. Here, the FIR 64 is a band-pass filter.

Figure 4:
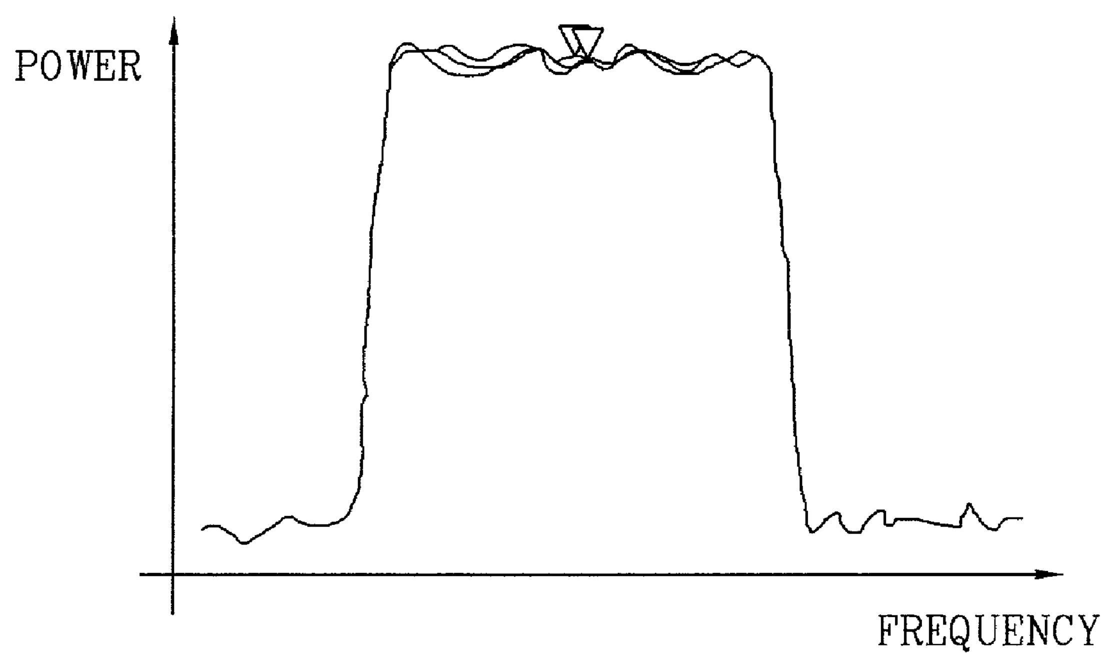
FIG. 4 is a drawing illustrating variation of an RF CDMA signal in a frequency domain.

The FFT unit 65 Fourier-converts the IF digital CDMA signal which has been filtered by the FIR 64 and computes an average power (Pavg1) of the RF CDMA signal in a frequency domain. That is, as shown in FIG. 4, the FFT unit 65 computes the average power (Pavg1) of the IF digital CDMA signal in the frequency domain corresponding to the band width (BW) of the FIR 64 according to following equation (1).

$$Pavg1 = \int_{-BW/2}^{+BW/2} V(f) * V(f)\,dt. \quad (1)$$

At this time, 'V(f)' indicates a frequency characteristic function of the filtered IF digital CDMA signal.

Accordingly, the digital processor 102 reads a compensation value stored in the memory 104 corresponding to the current temperature measured by the temperature sensor 103 and performs a temperature compensation for the average power (Pavg1) detected by the transmission power detecting unit 200. The compensation value is stored in the form of a look-up table.

As aforementioned, the transmission power detecting apparatus in accordance with the present invention performs digitally a power detection of the RF CDMA signal.

In addition, since the RF device (the RSSI detector) sensitive to a temperature change is not used, the power of the RF CDMA signal can be more accurately detected.

Moreover, since the IF analog CDMA signal to be measured is sampled by the ADC 62 and then an average power of the sampled digital IF CDMA signal is obtained, the power detection can be more accurately carried out.

Figure 5:
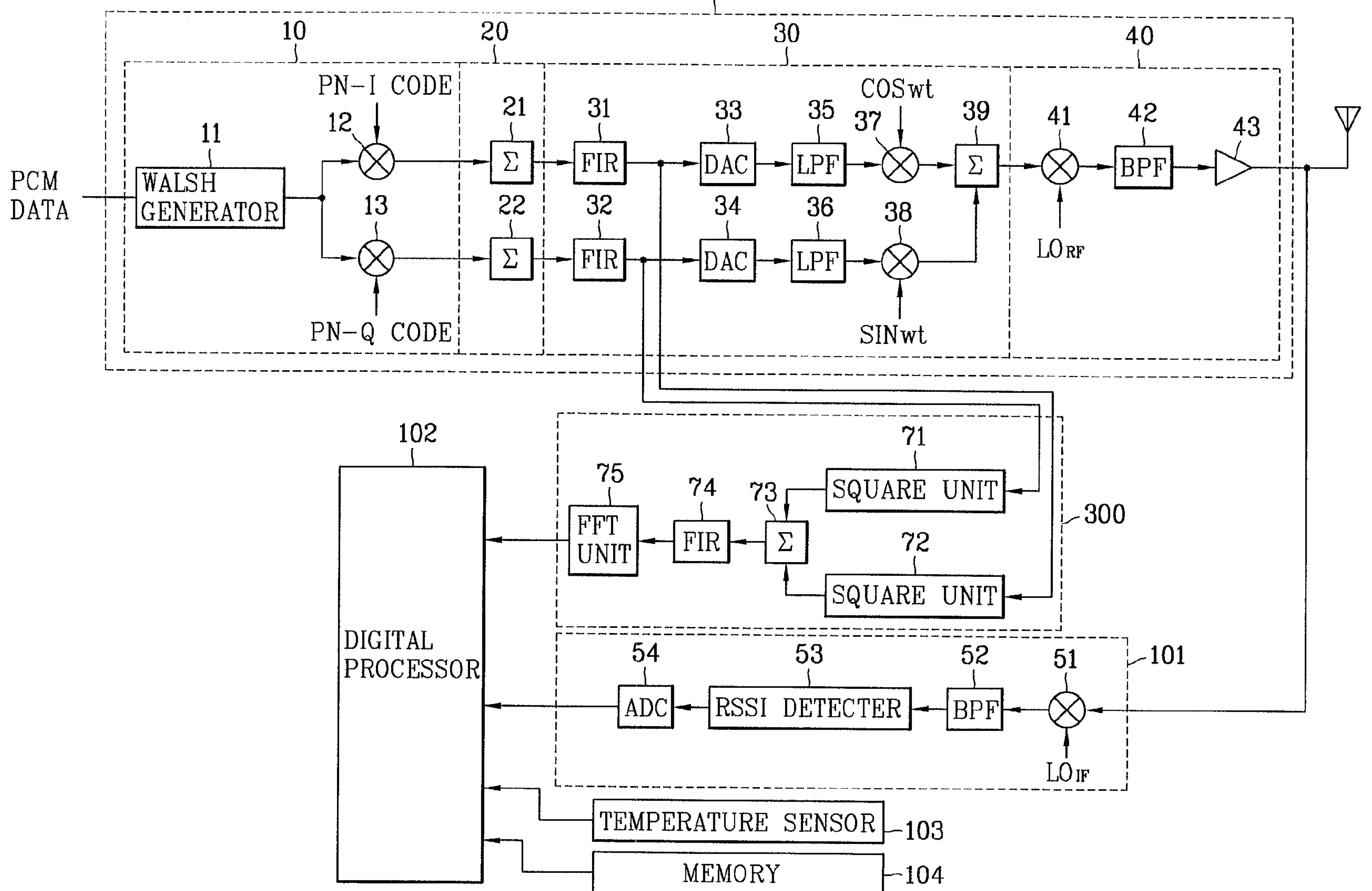
FIG. 5 is a drawing illustrating a transmission power adjusting apparatus of a CDMA system in accordance with a first embodiment of the present invention.

FIG. 5 is a drawing illustrating a transmission power adjusting apparatus of a CDMA system in accordance with a first embodiment of the present invention.

As shown in FIG. 5, a transmission power adjusting apparatus of a CDMA system includes an average power detecting unit 300 in addition to the conventional transmission power detecting apparatus. Same reference numerals are given to the same elements of the conventional transmission power detecting apparatus.

The average power detecting unit 300 measures an average power for a baseband digital CDMA signal. That is, square units 71 and 72 respectively square the channel 'I' and the channel 'Q' outputted from the FIR filters 31 and 32. An adder 73 adds the output signals of the square units 71 and 72 to generate one digital CDMA signal.

Figure 8:
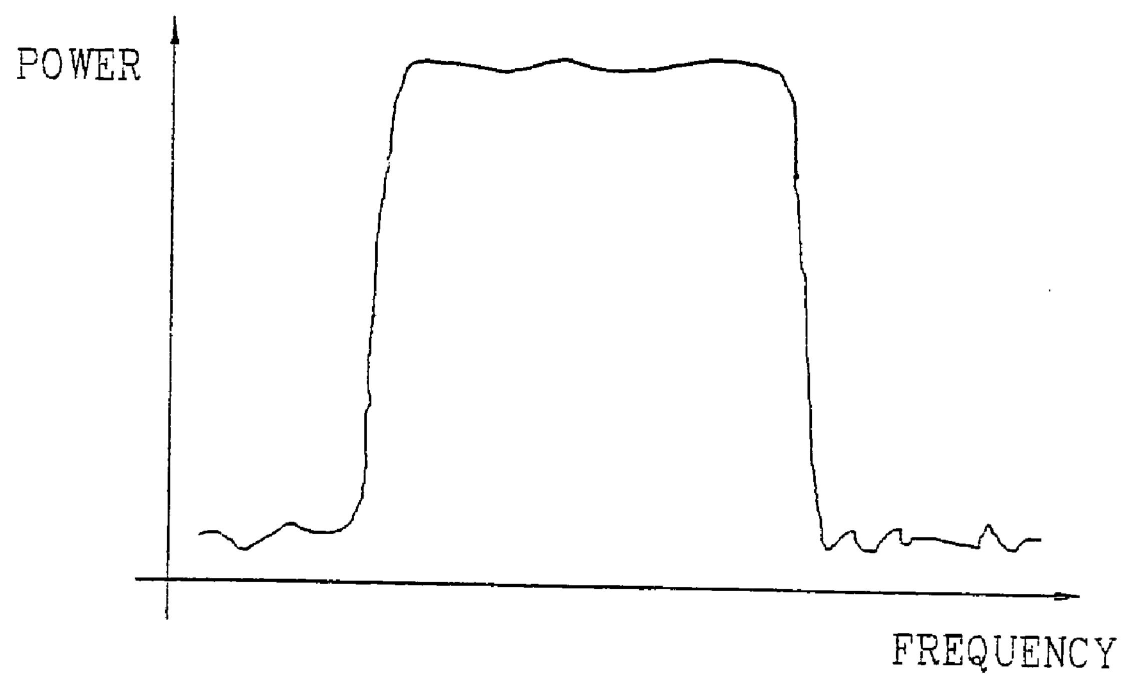
FIG. 8 is a drawing illustrating variation of a digital CDMA signal in a frequency domain.

As the digital CDMA signal is generated, an FIR 74 removes a high frequency component from the generated digital CDMA signal and outputs it to an FFT unit 75. Then, the FFT unit 75 Fourier-converts the output signal of the FIR 74 and computes an average power (Pavg2) of the digital CDMA signal in a frequency domain as shown in FIG. 8, in the same manner as equation (1).

At this time, the transmission power detector 101 detects a power of the RF CDMA signal in the form of voltage and outputs it to the digital processor 102.

Then, the digital processor 102 performs a temperature compensation for the voltage detected from the transmission power detector 101 with the compensation value stored in the memory 104 to check a power (a transmission power) of the RF CDMA signal which is being currently transmitted.

After checking the power of the RF CDMA signal, the digital processor 102 compares the power of the RF CDMA signal detected by the transmission power detector 101 with the average power (Pavg2) which has been detected by the average power detecting unit 300 and controls a gain of an attenuator (not shown) of the amplifier 43 of the RF signal processor.

At this time, the average power (Pavg2) detected by the average power detecting unit 300 is detected from the baseband digital CDMA signal without being influenced by a degradation of the RF device, a temperature characteristic and a noise, the digital processor 102 can control the power of the RF CDMA signal more accurately.

Figure 6:
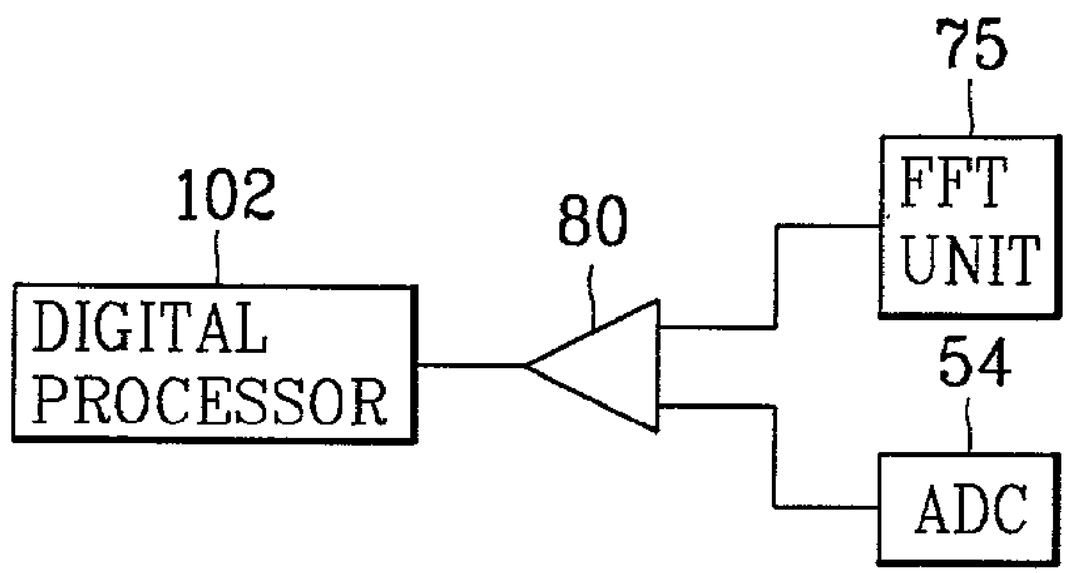
FIG. 6 is a drawing illustrating showing the construction for comparing an RF CDMA signal with a baseband CDMA signal.

With reference to FIG. 6, a comparator 80 may be prepared to compare output signals of the FFT unit 75 and ADC 54, so that the digital processor 102 can control the power of the RF CDMA signal according to the comparison result of the comparator 80.

In this manner, the transmission power adjusting apparatus in accordance with the first embodiment of the present invention detects a power of the baseband digital CDMA signal containing a traffic and provides a reference value for adjusting power of the RF CDMA signal, thereby reducing an error generated in determining the power of the RF CDMA signal which occurs in the conventional art.

Figure 7:
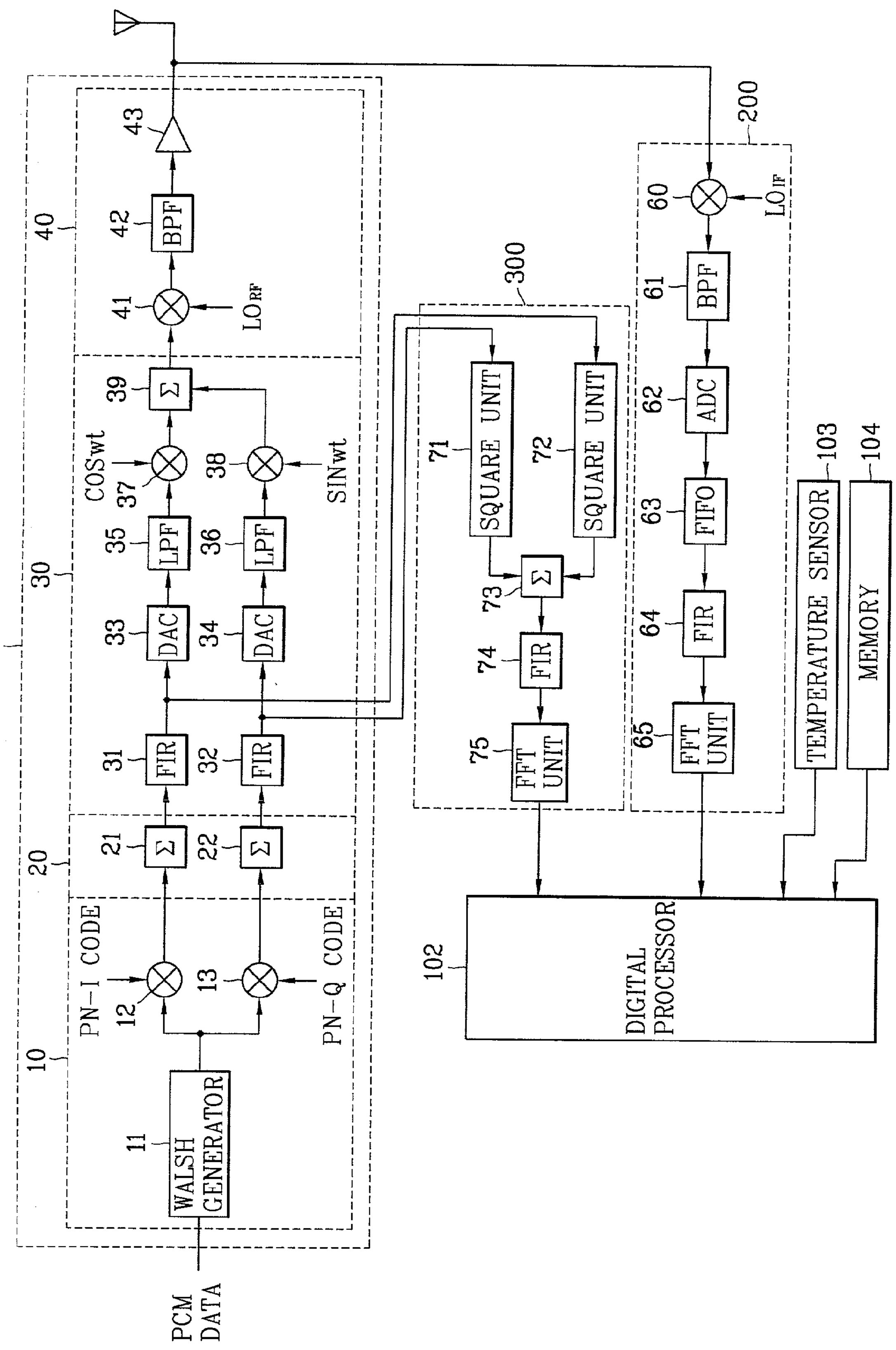
FIG. 7 is a drawing illustrating a transmission power adjusting apparatus of a CDMA system in accordance with a second embodiment of the present invention.

FIG. 7 is a drawing illustrating a transmission power adjusting apparatus of a CDMA system in accordance with a second embodiment of the present invention.

As shown in FIG. 7, the transmission power adjusting apparatus of a CDMA system in accordance with the second embodiment includes a transmission power detecting unit 200 in place of the transmission power detecting unit 101 as illustrated in FIG. 5.

Accordingly, as the outputs of the transmission power detecting unit 200 and the average power detecting unit 300 are simultaneously inputted to the digital processor 102, a transmission power can be detected more accurately.

As so far described, the transmission power detecting and adjusting apparatuses of a CDMA system have the following advantages.

That is, for example, first, since the power detection of the RF CDMA signal is digitally performed and no RF device (an RSSI detector) which is sensitive to a temperature change is used, a power of the RF CDMA signal can be more accurately detected.

Secondly, since an IF analog CDMA signal to be measure is sampled and then an average power of the sampled digital IF CDMA signal is obtained, accuracy in power detection and transmission power adjustment can be accomplished.

Lastly, since the power of the baseband digital CDMA signal containing a traffic is detected to provide a reference value for adjusting the power of the RF CDMA signal, an error generated in determining a power of the RF CDMA signal as in the conventional art can be reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structure described herein as performing the recited function and not only structural equivalents but also equivalent structures.

What is claimed is:

1. A transmission power detecting apparatus of a CDMA system comprising:

a base station transmitting unit for transmitting a radio frequency (RF) CDMA signal to a terminal; and a transmission power detecting unit for detecting an average power of the transmitted RF CDMA signal in a frequency domain, the transmission power detecting unit including:

a mixer to provide an intermediate frequency signal and to provide a filtered intermediate signal;

a first filter to filter the intermediate frequency signal;

a converter to provide a digital signal based on the filtered intermediate frequency signal;

a buffer to store the digital signal;

a second filter to filter the signal output from the buffer; and a unit to convert the signal output from the second filter and to determine the average power.

2. The apparatus of claim 1, further comprising: a digital processor for compensating the detected average power with a temperature compensation value stored in a memory and checking a power of the RF CDMA signal.

3. The apparatus of claim 2, wherein the temperature compensation value is stored in a look-up table format.

4. The apparatus of claim 1, wherein:

the mixer comprises a first mixer for down-converting the RF CDMA signal into the intermediate frequency (IF) signal;

the first filter comprises a first BPF for filtering the IF CDMA signal;

the converter comprises a first ADC for sampling the filtered IF CDMA signal and digital-converting said filtered IF CDMA signal;

the buffer comprises a FIFO (First-In, First-Out) for storing the digital-converted IF CDMA signal;

the second filter comprises a finite impulse response (FIR) filter for filtering the IF digital CDMA signal which has been outputted from the FIFO; and the unit comprises a Fourier transform (FFT) unit for Fourier-converting the filtered IF digital CDMA signal and computing said average power of the RF CDMA signal.

5. A transmission power detecting apparatus of a CDMA system comprising:

a base station transmitting unit for transmitting an RF CDMA signal to a terminal;

a transmission power detecting unit for detecting an average power of the RF CDMA signal in the frequency domain; and a digital processor for compensating the detected average power with a temperature compensation value stored in a memory and checking a power of the RF CDMA signal, the transmission power detecting unit including:

a mixer to provide an intermediate frequency signal;

a first filter to filter the intermediate frequency signal and provide a filtered intermediate signal;

a converter to provide a digital signal based on the filtered intermediate frequency signal; and a buffer to store the digital signal;

a second filter to filter the signal output from the buffer; and a unit to determine the average power based on an output of the second filter.

6. The apparatus of claim 5, wherein the mixer comprising a first mixer for down-converting the RF CDMA signal into the intermediate frequency (IF) signal;

the first filter comprises a first BPF for filtering the IF CDMA signal;

the converter comprising a first ADC for sampling the filtered IF CDMA signal and digital-converting said filtered IF CDMA signal;

the buffer comprises a FIFO (First-In, First-Out) for storing the digital-converted IF CDMA signal;

the second filter comprises a finite impulse response (FIR) filter for filtering the IF digital CDMA signal which has been outputted from the FIFO; and the unit comprising a Fourier transform (FFT) unit for Fourier-converting the filtered IF digital CDMA signal and computing said average power of the RF CDMA signal.

7. The apparatus of claim 6, wherein the FFT obtains said average power (Pavg) according to the following equation:

$$Pavg = \int_{-BW/2}^{+BW/2} V(f) * V(f)\, dt$$

wherein V(f) is a frequency characteristic function of the filtered IF digital CDMA signal and BW is a bandwidth of the FIR filter.

8. A transmission power adjusting apparatus comprising:

a base station transmitting unit for converting a baseband digital CDMA into an RF CDMA signal and transmitting said RF CDMA signal;

a transmission power detecting unit for detecting a power of the RF CDMA signal in a first frequency domain;

an average power detecting unit for detecting an average power of the baseband digital CDMA signal in a second frequency domain; and a digital processor for comparing the detected transmission power with the average power and controlling the power of the RF CDMA signal, wherein the average power detecting unit comprises:

first and second square units for respectively squaring digital CDMA signals of a channel 'I' and a channel 'Q' and providing respective output signals;

an adder for adding the output signals of first and second square units and providing a digital CDMA signal;

a FIR filter for filtering the digital CDMA signal outputted from the adder; and a FFT unit for Fourier-converting the digital CDMA signal outputted from the FIR filter and computing said average power of the baseband digital CDMA signal in the second frequency domain.

9. The apparatus of claim 8, wherein the first frequency domain is a low frequency domain.

10. The apparatus of claim 8, wherein the second frequency domain is an intermediate frequency domain.

11. The apparatus of claim 8, further comprising a comparator for comparing the magnitude of the transmission power with the average power.

12. The apparatus of claim 8, wherein the transmission power detecting unit comprises:

a first mixer for down-converting the RF CDMA signal into an intermediate frequency (IF) signal;

a first BPF for filtering the IF CDMA signal and providing a filtered IF CDMA signal;

a received signal strength indicator (RSSI) detector for detecting a strength of the filtered IF CDMA signal in the form of a voltage; and a first ADC for digital-converting the voltage detected by the RSSI detector and outputting said transmission power of the RF CDMA signal.

13. The apparatus of claim 8, wherein the transmission power detecting unit comprises:

a first mixer for down-converting the RF CDMA signal into an intermediate frequency (IF) signal;

a first BPF for filtering the IF CDMA signal and providing a filtered IF CDMA signal;

a first ADC for sampling the filtered IF CDMA signal and digital-converting said filtered IF CDMA signal;

a FIFO memory for storing the digital-converted IF CDMA signal;

a finite impulse response (FIR) filter for filtering the IF digital CDMA signal which has been outputted from the FIFO memory; and a first Fourier transform (FFT) unit for Fourier-converting the filtered IF digital CDMA signal and computing said power of the RF CDMA signal.

14. A transmission power adjusting apparatus of a base station transmitting instrument comprising:

a base station transmitting unit for converting a baseband digital CDMA signal into an RF CDMA signal and transmitting the RF CDMA signal;

a transmission power detecting unit for detecting an average power of the RF CDMA signal in a first frequency domain;

an average power detecting unit for detecting a power of the baseband digital CDMA signal in a second frequency domain; and a digital processor for comparing the detected transmission power with said average power and controlling a power of the RF CDMA signal, wherein the average power detecting unit comprising:

first and second square units for respectively squaring digital CDMA signals of a channel 'I' and a channel 'Q' and providing respective output signals;

an adder for adding the output signals of first and second square units and providing a digital CDMA signal;

a FIR filter for filtering the digital CDMA signal outputted from the adder; and a EFT unit for Fourier-converting the digital CDMA signal outputted from the FIR filter and computing said average power of the baseband digital CDMA signal in the second frequency domain.

15. The apparatus of claim 4, wherein the first frequency domain is a low frequency domain, and the second frequency domain is an intermediate frequency domain.

16. The apparatus of claim 14, further comprising: a second adder for comparing the magnitude of the transmission power with the average power.

17. The apparatus of claim 14, wherein the transmission power detecting unit comprises:

a first mixer for down-converting the RF CDMA signal into an intermediate frequency (IF) signal;

a first BPF for filtering the IF CDMA signal and providing a filtered IF CDMA signal;

a received signal strength indicator (RSSI) detector for detecting a strength of the filtered IF CDMA signal in the form of a voltage; and a first ADC for digital-converting the voltage detected by the RSSI detector and outputting said transmission power of the RF CDMA signal.

18. The apparatus of claim 14, wherein the transmission power detecting unit comprises:

a first mixer for down-converting the RF CDMA signal into an intermediate frequency (IF) signal;

a first BFF for filtering the IF CDMA signal and providing a filtered IF CDMA signal;

a first ADC for sampling the filtered IF CDMA signal and digital-converting said filtered IF CDMA signal;

a FIFO memory for storing the digital-converted IF CDMA signal;

a finite impulse response (FIR) filter for filtering the IF digital CDMA signal which has been outputted from the FIFO memory; and a Fourier transform (FFT) unit for Fourier-converting the filtered IF digital CDMA signal and computing said power of the RF CDMA signal.

* * * * *